(12) United States Patent
Theuss et al.

(10) Patent No.: US 8,080,993 B2
(45) Date of Patent: Dec. 20, 2011

(54) SENSOR MODULE WITH MOLD ENCAPSULATION FOR APPLYING A BIAS MAGNETIC FIELD

(75) Inventors: Horst Theuss, Wenzenbach (DE); Helmut Wietschorke, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 483 days.

(21) Appl. No.: 12/056,776

(22) Filed: Mar. 27, 2008

(65) Prior Publication Data
US 2009/0243595 A1   Oct. 1, 2009

(51) Int. Cl.
G01R 33/07 (2006.01)
G01R 33/02 (2006.01)
H01L 27/22 (2006.01)

(52) U.S. Cl. ........ 324/251; 324/249; 324/252; 327/511; 438/15

(58) Field of Classification Search .......... 324/173–174, 324/207.2, 207.21, 207.25, 249, 251–252; 73/514.31, 514.39; 123/612, 617; 257/421–427; 327/510–511; 438/15
See application file for complete search history.

(56) References Cited

U.S. PATENT DOCUMENTS

| | | | |
|---|---|---|---|
| 3,976,938 A * | 8/1976 | Hesterman .................... 324/248 |
| 4,188,605 A * | 2/1980 | Stout ............................ 338/32 H |
| 5,210,489 A | 5/1993 | Petersen |
| 5,521,501 A | 5/1996 | Dettmann et al. |
| 5,796,249 A | 8/1998 | Andraet et al. |
| 6,069,476 A | 5/2000 | Vieux-Rochaz et al. |
| 6,107,793 A | 8/2000 | Yokotani et al. |
| 6,228,146 B1 | 5/2001 | Kuespert |
| 6,246,233 B1 | 6/2001 | Griffen et al. |
| 6,278,269 B1 | 8/2001 | Vig et al. |
| 6,300,758 B1 | 10/2001 | Griffen et al. |
| 6,448,760 B1 * | 9/2002 | Neumann et al. ......... 324/207.2 |
| 6,692,676 B1 | 2/2004 | Vig et al. |
| 6,882,146 B2 | 4/2005 | Maiwald |
| 6,987,312 B2 | 1/2006 | Theuss |
| 7,030,601 B2 | 4/2006 | Buchhold |
| 7,056,764 B2 | 6/2006 | Auburger et al. |
| 7,061,098 B2 | 6/2006 | Meckes et al. |
| 7,112,955 B2 | 9/2006 | Buchhold |
| 7,208,944 B2 | 4/2007 | Tatschl et al. |
| 7,231,325 B2 | 6/2007 | Motz et al. |
| 7,250,760 B2 | 7/2007 | Ao |
| 2001/0009367 A1 | 7/2001 | Seitzer et al. |

(Continued)

FOREIGN PATENT DOCUMENTS

CA   2 083 008   1/2001

(Continued)

OTHER PUBLICATIONS

Sura Magnets AG webpage entitled "Magnetic Materials—Injection Moulded;" available at http://www.suramagnets.se/products_materials_group.php?IngMGID=3; 1 pg.

(Continued)

*Primary Examiner* — Bot L LeDynh
(74) *Attorney, Agent, or Firm* — Dicke, Billig & Czaja, PLLC

(57) ABSTRACT

A method of manufacturing a sensor module includes providing a substrate comprising a magnetically sensitive sensor element. The sensor element and the substrate are encapsulated with at least one mold material that is configured to apply a bias magnetic field to the sensor element.

20 Claims, 7 Drawing Sheets

U.S. PATENT DOCUMENTS

| | | | |
|---|---|---|---|
| 2002/0024109 A1 | 2/2002 | Hayat-Dawoodi | |
| 2004/0174164 A1 | 9/2004 | Ao | |
| 2005/0263866 A1* | 12/2005 | Wan | 257/678 |
| 2005/0278136 A1 | 12/2005 | Werth | |
| 2006/0077032 A1* | 4/2006 | Momose et al. | 338/32 R |
| 2006/0131712 A1 | 6/2006 | Jerebic et al. | |
| 2006/0156108 A1 | 7/2006 | Stracke et al. | |
| 2006/0202692 A1 | 9/2006 | Tatschl et al. | |
| 2007/0018642 A1* | 1/2007 | Ao | 324/252 |
| 2007/0069354 A1 | 3/2007 | Dangelmaier et al. | |
| 2007/0145972 A1 | 6/2007 | Auburger et al. | |
| 2007/0182029 A1 | 8/2007 | Franosch et al. | |
| 2007/0205762 A1* | 9/2007 | Nakata et al. | 324/207.25 |
| 2007/0222005 A1 | 9/2007 | Schmitt | |
| 2008/0034867 A1* | 2/2008 | Kazama et al. | 73/514.33 |
| 2008/0211488 A1* | 9/2008 | Kang | 324/207.2 |
| 2008/0290430 A1* | 11/2008 | Mahadevan et al. | 257/418 |

FOREIGN PATENT DOCUMENTS

| | | |
|---|---|---|
| DE | 4121374 | 1/1993 |
| DE | 43 19 146 C2 | 12/1994 |
| DE | 19520206 | 12/1996 |
| DE | 196 20 548 C2 | 10/2001 |
| DE | 10220911 | 12/2003 |
| DE | 102004063539 | 9/2005 |
| DE | 10 2005 047 413 A | 9/2006 |
| EP | 0 357 200 A2 | 3/1990 |
| EP | 0 464 892 A2 | 1/1992 |
| EP | 0617792 | 12/1992 |
| EP | 0 898 180 | 11/2004 |
| JP | 61061481 A | 3/1986 |
| JP | 02271258 A | 6/1990 |
| WO | 98/48291 | 10/1998 |
| WO | 03/019217 A1 | 3/2003 |
| WO | 03/040659 A1 | 5/2003 |
| WO | 2007/096806 A2 | 8/2007 |

OTHER PUBLICATIONS

Infineon Technologies data book entitled "6.6 Application Notes: Differential Hall IC TLE 4921-3U;" Jan. 7, 2000; pp. 31-51.

M. Brunnbauer et al., publication entitled "Embedded Wafer Level Ball rid Array (eWLB);" 2006 Electronics Packaging Technology Conference; 5 pgs.

Infineon Technologies publication entitled "TLE5011—GMR Based Angular Sensor;" Target Data Sheet, V 0.1; Apr. 2007; 56 pgs.

Infineon Technolgies publication entitled "TLE5010—GMR Based Angular Sensor;" Target Data Sheet, V 0.9; May 2007; 56 pgs.

Ausserlechner application entitled "Magnetic Sensor Integrated Circuit with Test Conductor;" U.S. Appl. No. 11/868,845, filed Oct. 8, 2007; 30 pgs.

* cited by examiner

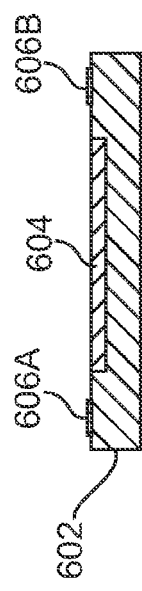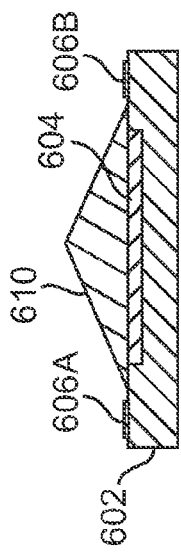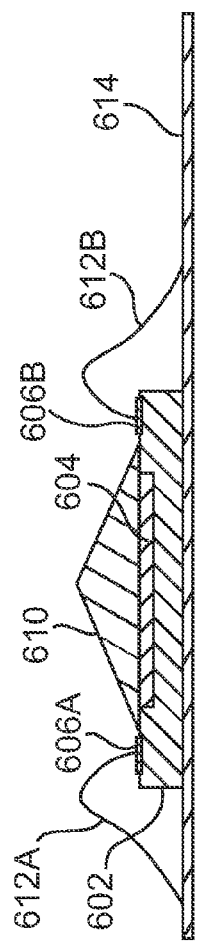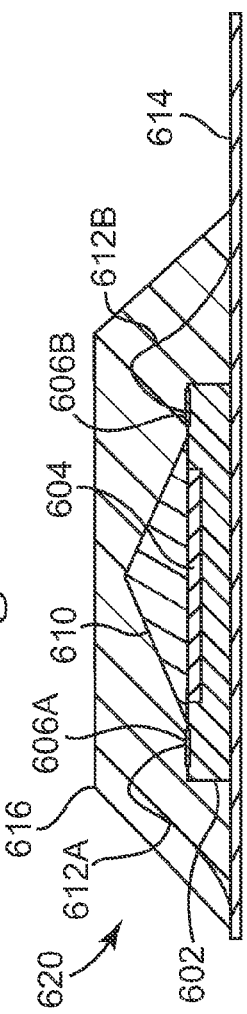
Fig. 6A
Fig. 6B
Fig. 6C
Fig. 6D

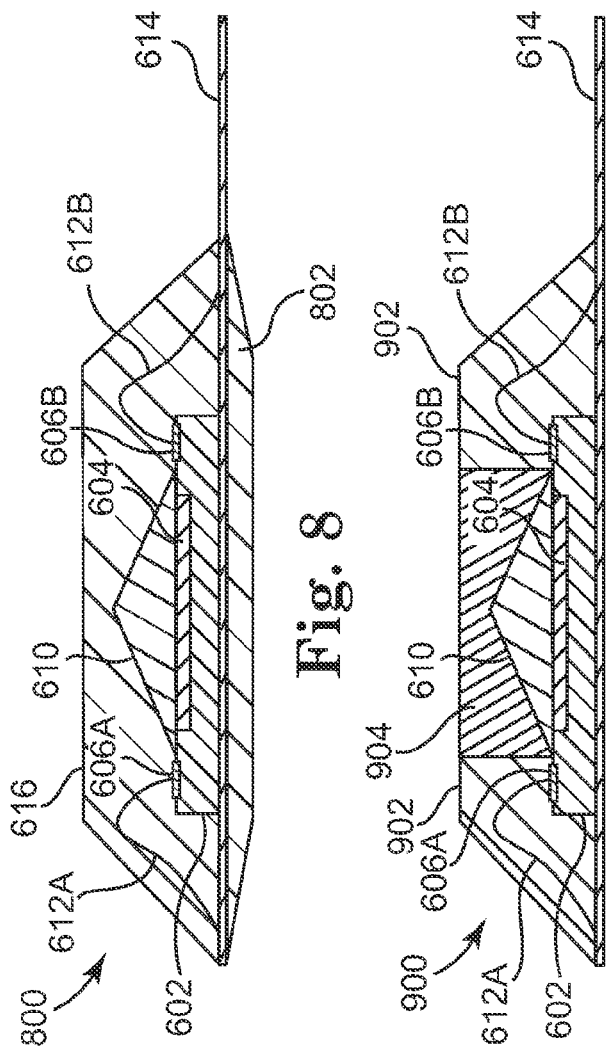
Fig. 8
Fig. 9
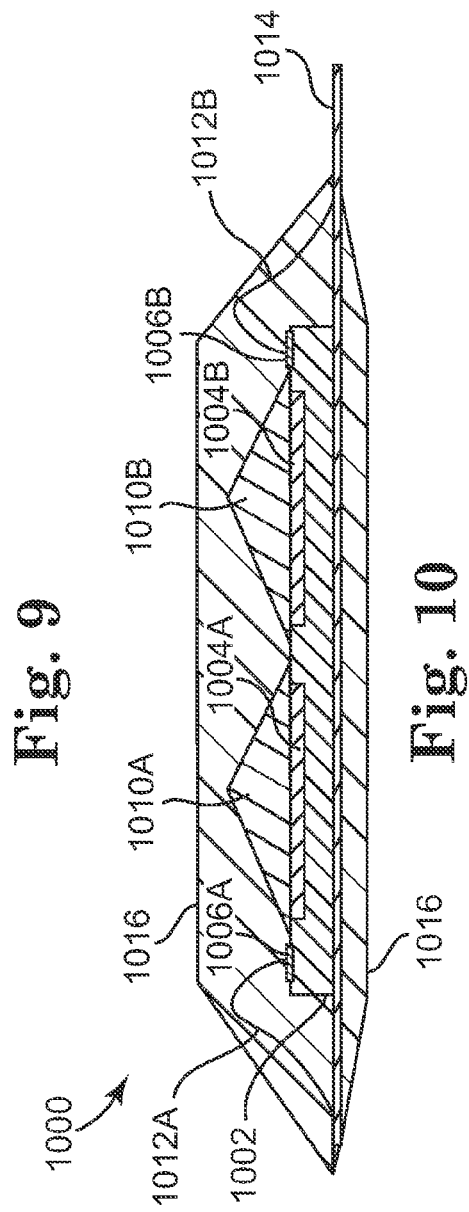
Fig. 10

SENSOR MODULE WITH MOLD ENCAPSULATION FOR APPLYING A BIAS MAGNETIC FIELD

BACKGROUND

Some magnetic speed sensors are configured to measure the speed of a magnetic tooth wheel. Such speed sensors typically include an integrated circuit with a plurality of magnetic sensor elements, such as Hall sensor elements or giant magneto resistance (GMR) sensor elements. A permanent magnet provides a bias magnetic field to the sensor elements. As the wheel is rotated, the teeth of the wheel pass in front of the sensor and generate a small field variation, which is detected by the integrated circuit. The detected field contains information about the angular position and rotational speed of the wheel.

GMR sensors were first manufactured in the 1980's. They are distinguished by their high sensitivity of their electrical resistance to the orientation of an external magnetic field. The GMR effect takes place in a limited range along one axis of the magnetic field. This range is referred to as the anisotropic range. In the anisotropic range, the sensor has a high sensitivity (resistance change versus magnetic field change). In some applications, such as a magnetic speed sensor with a back bias magnet for measuring the speed of a magnetic tooth wheel, a small misplacement or inclination of the back bias magnet with respect to a GMR element of the sensor can drive the working point of the GMR element into saturation. The back bias magnet creates an offset in the working point of the sensor from an optimal point near the center of the anisotropic range, to the saturation region. As a result, no signal or a signal of reduced quality is generated, thereby lowering the sensor performance. For gradiometric sensors that operate on a differential principle, the offset problem becomes worse as the sensor elements are located in two different positions.

SUMMARY

One embodiment provides a method of manufacturing a sensor module. The method includes providing a substrate comprising a magnetically sensitive sensor element. The sensor element and the substrate are encapsulated with at least one mold material that is configured to apply a bias magnetic field to the sensor element.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 6A-6D are diagrams illustrating cross-sectional views of a sensor module and a method of manufacturing a sensor module according to one embodiment.

FIG. 8 is a diagram illustrating cross-sectional view of a sensor module according to another embodiment.

FIG. 9 is a diagram illustrating a cross-sectional view of a sensor module with two mold structures according to one embodiment.

FIG. 10 is a diagram illustrating a cross-sectional view of a sensor module with a plurality of magnetically-sensitive sensor elements according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
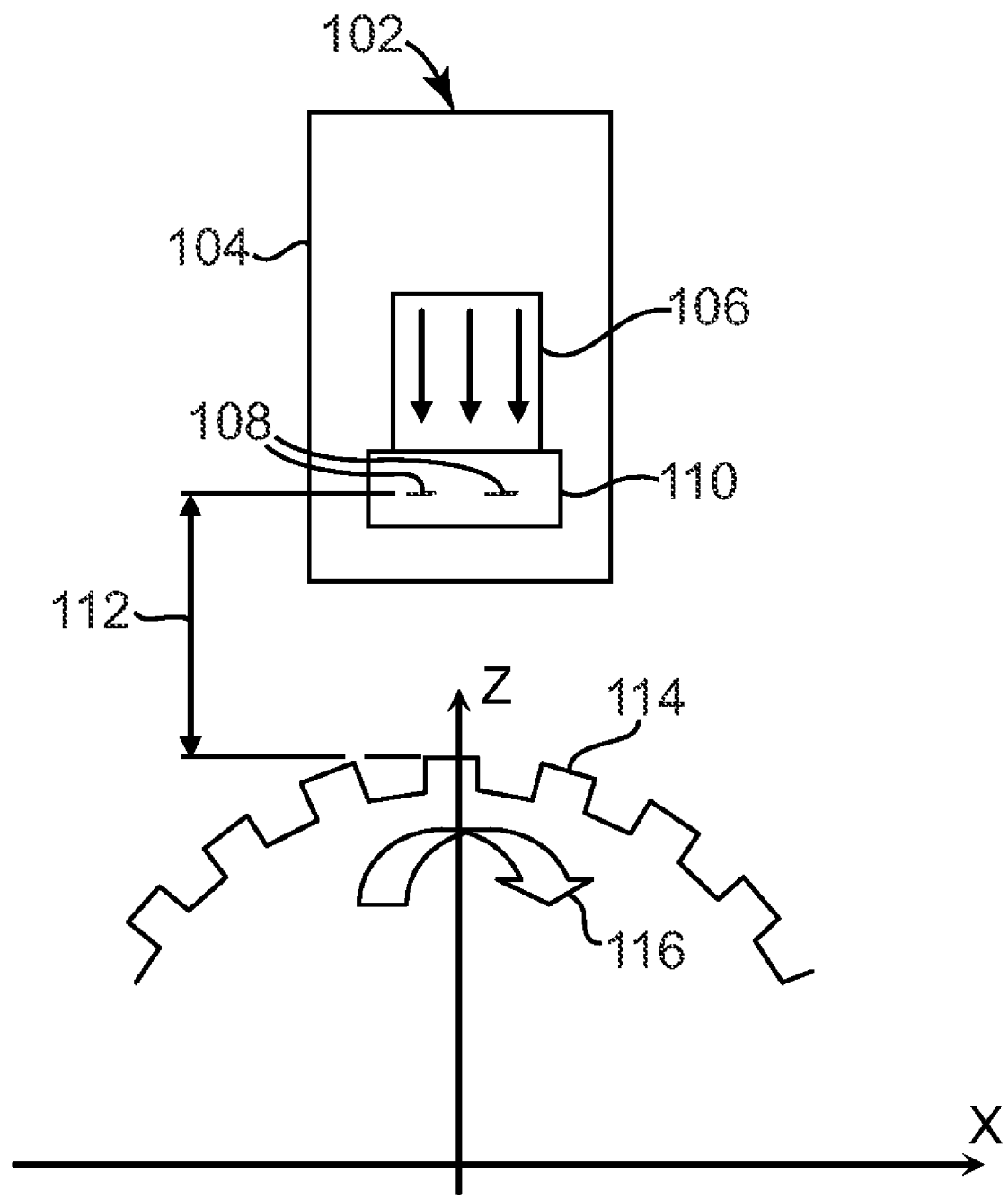
FIG. 1 is diagram illustrating a prior art speed sensor for sensing the speed of a magnetic tooth wheel.

FIG. 1 is a diagram illustrating a prior art speed sensor 102 for sensing the speed of a magnetic tooth wheel 114. The speed sensor 102 includes a permanent magnet 106 and a magnetic sensor integrated circuit 110 surrounded by a protective cover 104. The magnetic sensor integrated circuit 110 includes a plurality of magnetically sensitive elements 108, such as Hall sensor elements or GMR sensor elements. The permanent magnet 106 provides a bias magnetic field to the elements 108. In the illustrated embodiment, the bias magnetic field is perpendicular to the plane of the integrated circuit 110 and the plane of the magnetically sensitive elements 108 (e.g., in the Z-direction). The elements 108 are separated from the magnetic tooth wheel 114 by an air gap distance 112. As the wheel 114 is rotated in the direction shown by arrow 116, the teeth of the wheel 114 pass in front of the sensor 102 and generate a small field variation, which is detected by the integrated circuit 110. The detected field contains information about the angular position and rotational speed of the wheel 114. The waveform of the field is nearly sinusoidal and its amplitude decreases drastically with the air gap 112.

Figure 2B:
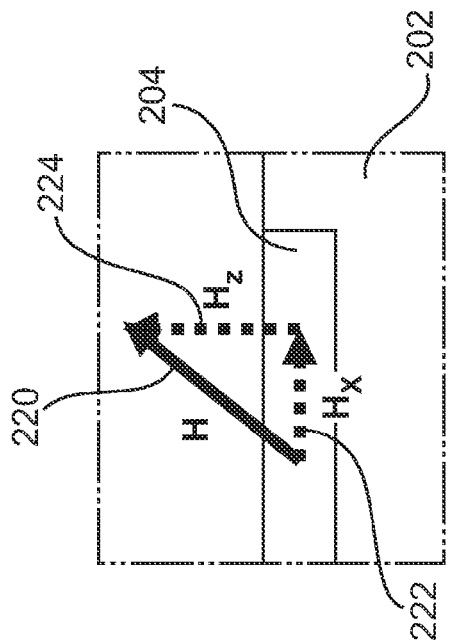
FIG. 2B is a diagram illustrating a portion of the magnetic sensor chip (shown in FIG. 2A) along with components of the bias magnetic field.
Figure 2A:
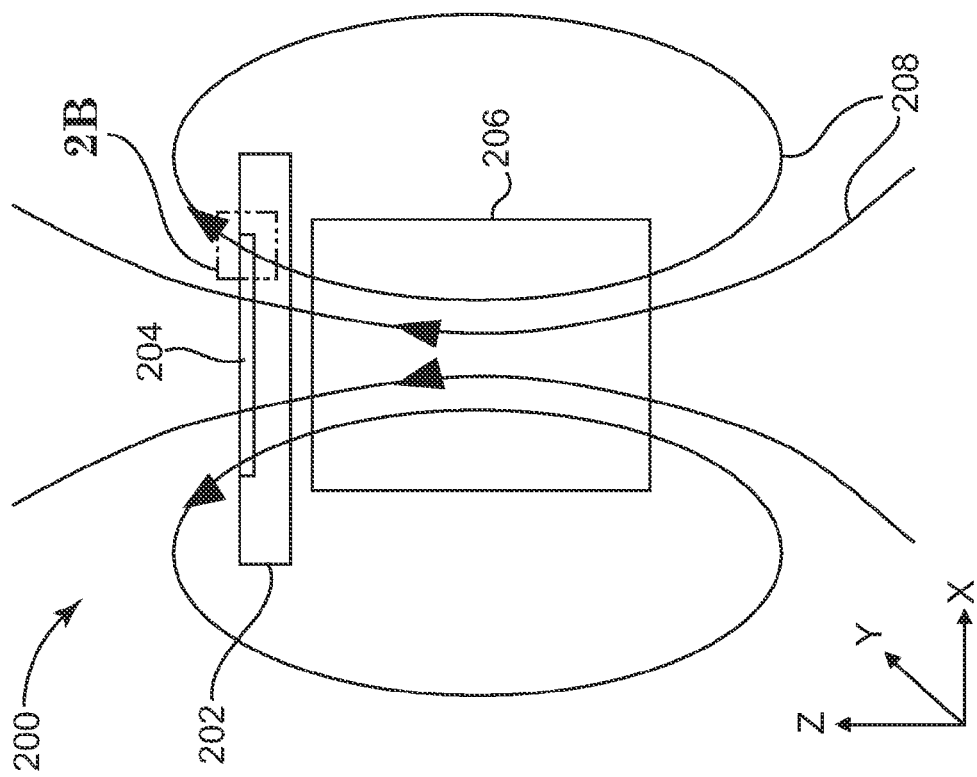
FIG. 2A is a diagram illustrating a magnet sensor with a permanent magnet for providing a bias magnetic field.

FIG. 2A is a diagram illustrating a magnet sensor 200 with a permanent magnet 206 for providing a bias magnetic field. Magnetic sensor 200 includes a magnetic sensor chip 202 and a permanent magnet 206. The magnetic sensor chip 202 includes a magnetically sensitive sensor element 204 positioned on a top surface thereof. The permanent magnet 206 is positioned adjacent to a bottom surface of the sensor chip 202. The bias magnetic field produced by permanent magnet 206 is represented by flux lines 208.

A set of orthogonal X-Y-Z axes are also shown in FIG. 2A. The X-axis and the Y-axis are parallel to the plane of the sensor element 204. The Z-axis is perpendicular to the plane of the sensor element 204. GMR sensors are typically sensitive to only one component of the magnetic field (e.g., the X-component or the Y-component). It is desirable for the permanent magnet 206 to produce a magnetic field that is perpendicular to the sensor plane (i.e., a magnetic field with a Z-component, but no X or Y component, at the location of the sensor element 204). The field produced by the magnet 206 is modulated (e.g., by a passing magnetic tooth wheel) to generate the X-field or Y-field signal. Due to the properties of the GMR element, the signal is converted into a resistance change.

FIG. 2B is a diagram illustrating a portion of the magnetic sensor chip 202 (shown in FIG. 2A) along with components of the bias magnetic field. The bias magnetic field at the portion of the chip 202 shown in FIG. 2B is represented by vector (H) 220. As shown in FIG. 2B, the bias magnetic field at the illustrated location is not exactly perpendicular to the plane of the chip 202 and sensor element 204 (i.e., perpendicular to the X-Y plane), but rather the vector 220 includes a vertical component ($H_Z$) 224 and a lateral component ($H_X$) 222.

As mentioned above, it is desirable in some applications to have a substantially homogeneous bias magnetic field that is perpendicular or substantially perpendicular to the plane of the sensor element (e.g., in the Z-direction), with little or no lateral components. Some magnetic sensors are very sensitive to the lateral components, and can quickly go into saturation if the lateral components in the bias field are too large. Techniques for limiting the lateral components of the bias field include modifying the shape of the permanent magnet and/or using an additional element to shape or guide the magnetic field produced by the permanent magnet. These techniques are described in further detail below with reference to FIGS. 3-5.

Figure 3:
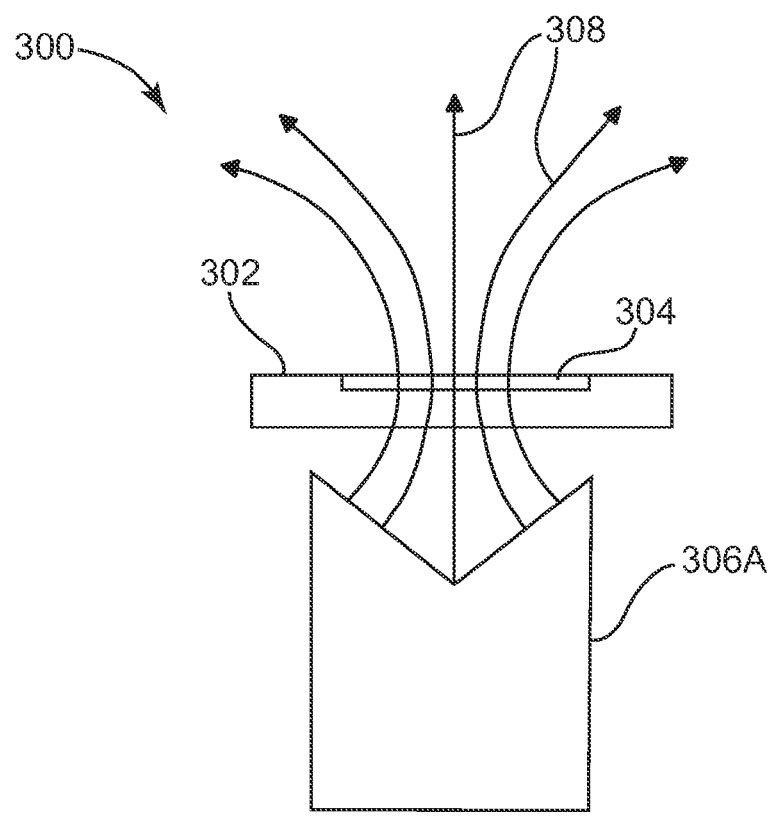
FIG. 3 is a diagram illustrating a magnetic sensor with a permanent magnet having a groove or cavity formed therein for providing a bias magnetic field.

FIG. 3 is a diagram illustrating a magnetic sensor 300 with a permanent magnet 306A having a groove or cavity formed therein for providing a bias magnetic field. Magnetic sensor 300 includes a magnetic sensor chip 302 and a permanent magnet 306A. The magnetic sensor chip 302 includes a magnetically sensitive sensor element 304 positioned on a top surface thereof. The permanent magnet 306A is positioned adjacent to a bottom surface of the sensor chip 302. The bias magnetic field produced by permanent magnet 306A is represented by flux lines 308. As shown in FIG. 3, a V-shaped groove or cavity has been formed in a top surface of the permanent magnet 306A, which helps to improve the verticality and limit any lateral components of the bias magnetic field at the location of the sensor element 304.

Figure 4:
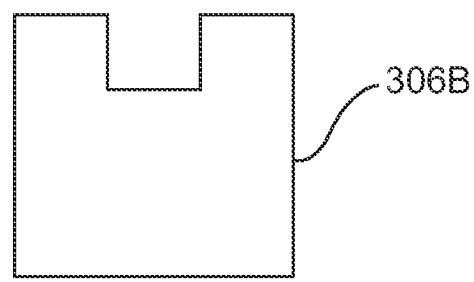
FIG. 4 is a diagram illustrating an alternative shape for the permanent magnet shown in FIG. 3.

FIG. 4 is a diagram illustrating an alternative shape for the permanent magnet 306A shown in FIG. 3. As shown in FIG. 4, permanent magnet 306B includes a square or U-shaped cavity formed in a top surface thereof. This shaping of the permanent magnet helps to improve the verticality and limit any lateral components of the bias magnetic field at the location of the sensor element 304.

There are several disadvantages involved with using a specially-shaped permanent magnet. There is an additional cost involved in forming the special shape. The sensor element is typically installed in a semiconductor housing, and the distance between the sensor element and the permanent magnet is limited by the housing. In addition, the effectiveness of this approach is highly dependent on the relative locations of the permanent magnet and the sensor element. Small positioning errors can result in an increase in the lateral components of the bias magnetic field.

Figure 5:
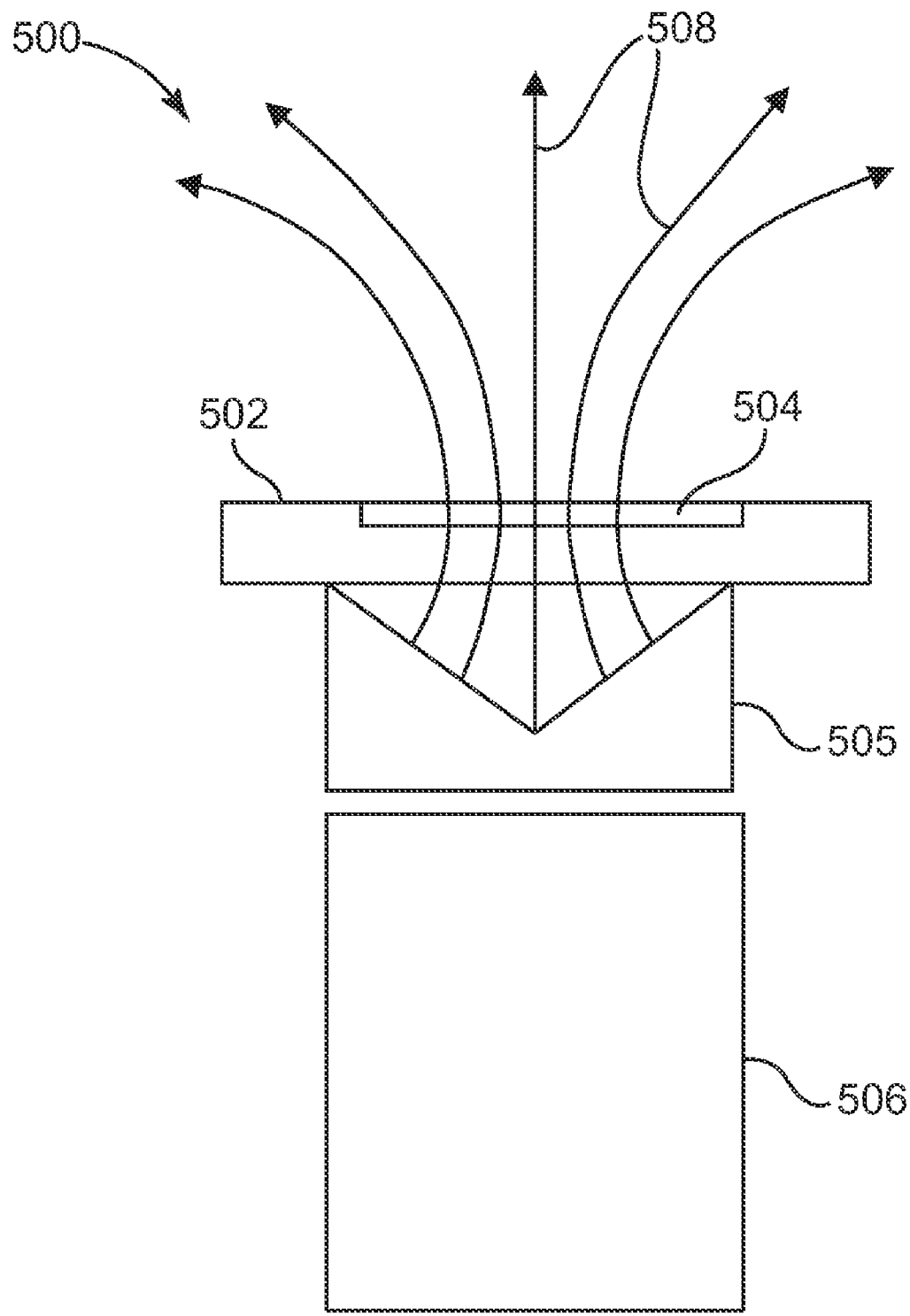
FIG. 5 is a diagram illustrating a magnetic sensor with a permanent magnet and a magnetic field guidance element.

FIG. 5 is a diagram illustrating a magnetic sensor 500 with a permanent magnet 506 and a magnetic field guidance element 505. Magnetic sensor 500 includes a magnetic sensor chip 502, magnetic field guidance element 505, and permanent magnet 506. The magnetic sensor chip 502 includes a magnetically sensitive sensor element 504 positioned on a top surface thereof. The permanent magnet 506 and the guidance element 505 are positioned adjacent to a bottom surface of the sensor chip 502. Permanent magnet 506 generates a bias magnetic field for sensor chip 502. The bias magnetic field is shaped or guided by guidance element 505. As shown in FIG. 5, a V-shaped groove or cavity has been formed in a top surface of the guidance element 505. A square or U-shaped groove or cavity, such as that shown in FIG. 4, may alternatively be formed in guidance element 505. The resulting bias magnetic field as modified by guidance element 505 is represented by flux lines 508. The guidance element 505 helps to improve the verticality and limit any lateral components of the bias magnetic field at the location of the sensor element 504.

There are several disadvantages involved with using a specially-shaped magnetic field guidance element. There is an additional cost involved in producing a guidance element with the desired shape. The sensor element is typically installed in a semiconductor housing, and the distance between the sensor element and the permanent magnet is limited by the housing. In addition, the effectiveness of this approach is highly dependent on the relative locations of the permanent magnet, the guidance element, and the sensor element. Small positioning errors can result in an increase in the lateral components of the bias magnetic field.

FIGS. 6A-6D are diagrams illustrating cross-sectional views of a sensor module and a method of manufacturing a sensor module according to one embodiment. As shown in FIG. 6A, a magnetically sensitive sensor element 604 and a plurality of electrical contacts 606A and 606B are formed on a top surface of a substrate 602. In one embodiment, substrate 602 is a semiconductor substrate, such as a semiconductor wafer or a semiconductor die. In another embodiment substrate 602 is another type of substrate. In one embodiment, sensor element 604 is a GMR element or a Hall element. In another embodiment, sensor element 604 is another type of sensor element. In one embodiment, sensor element 604 is a spin-valve GMR sensor element, and includes a reference layer with a fixed magnetization direction and a sensor layer which can rotate its magnetization according to an external in-plane magnetic field. In one embodiment, substrate 602 includes an evaluation integrated circuit (not shown) for processing signals generated by sensor element 604.

As shown in FIG. 6B, a non-magnetic structure 610 is formed on the sensor element 604. In one embodiment, structure 610 is a polymer, such as SU8, that can be patterned using conventional photolithography. SU8 is a negative photoresist material. Uncured SU8 can be in liquid or dry film form. Liquid SU8 can be coated onto a substrate by, for example, spin or spray coating. A dry SU8 film can be laminated onto a substrate. SU8 is typically cured using both UV and thermal curing steps.

In one embodiment, a polymer layer is deposited on sensor element 604, and then the polymer layer is etched to produce the structure 610 shown in FIG. 6B. In one embodiment, structure 610 has a conical shape with a decreasing cross-sectional area as the distance from the sensor element 604 increases. In another embodiment, structure 610 has a convex shape.

As shown in FIG. 6C, substrate 602 is positioned on a chip carrier 614, and electrical interconnects 612A and 612B are connected to the contacts 606A and 606B, respectively. The electrical interconnects 612A and 612B are also connected to chip carrier 614. In one embodiment, chip carrier 614 is a lead frame and interconnects 612A and 612B are bond wires. In another embodiment, chip carrier 614 is a printed circuit board (PCB) or other chip carrier, and interconnects 612A and 612B are solder elements (e.g., in a flip-chip configuration) or another type of interconnect.

As shown in FIG. 6D, a magnetic mold structure 616 is formed over the device shown in FIG. 6C, thereby encapsulating the substrate 602, contacts 606A and 606B, sensor element 604, structure 610, and bond wires 612A and 612B, and thereby forming magnetic sensor module 620. In one embodiment, mold structure 616 is formed using an injection molding process. In another embodiment, mold structure 616 is formed using a compression molding process. In one embodiment, mold structure 616 comprises a thermosetting polymer that is filled with magnetic particles (e.g., micro magnets) or particles that are configured to be magnetized. Most magnetic materials can be milled to a powder suitable for mixing with a polymer mold material. In one embodiment, an external magnetic field is applied to sensor module 620 to magnetize the particles in mold structure 616, and thereby configure mold structure 616 to produce a bias magnetic field for sensor element 604.

Figure 7:
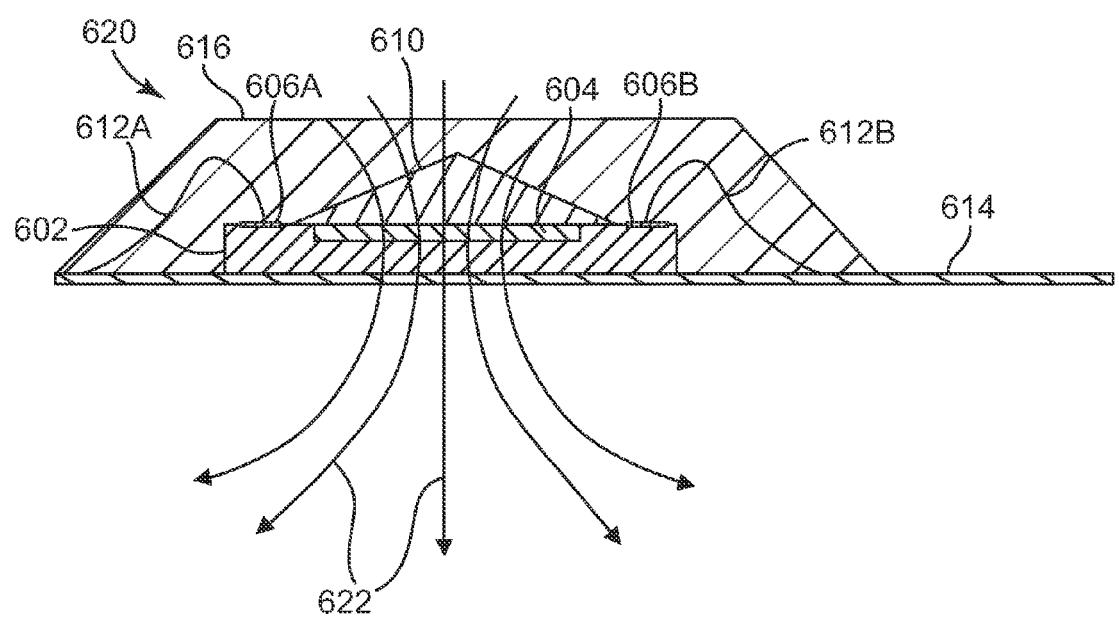
FIG. 7 is a diagram illustrating a cross-sectional view of a sensor module and a bias magnetic field produced by the sensor module according to one embodiment.

FIG. 7 is a diagram illustrating a cross-sectional view of sensor module 620 and a bias magnetic field produced by the sensor module 620 according to one embodiment. Mold structure 616 generates the bias magnetic field. In one embodiment, structure 610 is configured as a magnetic field guidance element that shapes or guides the bias magnetic field produced by mold structure 616. The bias magnetic field as modified by structure 616 is represented by flux lines 622. The structure 610 helps to improve the verticality and limit any lateral components of the bias magnetic field at the location of the sensor element 604. In one embodiment, sensor module 620 is configured to measure the speed or position of teeth of a magnetic gear wheel (or magnetic tooth wheel).

FIG. 8 is a diagram illustrating a cross-sectional view of a sensor module 800 according to another embodiment. In the illustrated embodiment, sensor module 800 is the same as sensor module 620 (FIG. 7), with the exception that a mold structure 802 is also formed at the bottom surface of the chip carrier 614. In one embodiment, mold structures 616 and 802 are formed at the same time with the same mold material, and form a continuous encapsulation structure. In one embodiment, mold structure 802 is magnetic and, along with mold structure 616, applies a bias magnetic field to sensor element 604. In another embodiment, mold structure 802 is a non-magnetic mold material.

FIG. 9 is a diagram illustrating a cross-sectional view of a sensor module 900 with two mold structures 902 and 904 according to one embodiment. In one embodiment, mold structure 904 is a magnetic mold structure (e.g., a thermosetting polymer with magnetic particles) that provides a bias magnetic field for sensor element 604 and that is formed in essentially the same manner as mold structure 616, which is described above with respect to FIG. 6D. However, rather than encapsulating the substrate 602, contacts 606A and 606B, sensor element 604, structure 610, and bond wires 612A-612B, like mold structure 616, mold structure 904 encapsulates sensor element 604 and structure 610. In one embodiment, mold structure 902 is a non-magnetic thermosetting polymer that is formed in essentially the same manner as mold structure 616, which is described above with respect to FIG. 6D. In the illustrated embodiment, mold structure 902 encapsulates mold structure 904, substrate 602, contacts 606A and 606B, sensor element 604, structure 610, and bond wires 612A-612B.

FIG. 10 is a diagram illustrating a cross-sectional view of a sensor module 1000 with a plurality of magnetically-sensitive sensor elements according to one embodiment. As shown in FIG. 10, magnetically sensitive sensor elements 1004A and 1004B, and a plurality of electrical contacts 1006A and 1006B, are formed on a top surface of a substrate 1002. In one embodiment, substrate 1002 is a semiconductor substrate, such as a semiconductor wafer or a semiconductor die. In another embodiment substrate 1002 is another type of substrate. In one embodiment, sensor elements 1004A and 1004B are GMR elements or Hall elements. In another embodiment, sensor elements 1004A and 1004B are another type of sensor element.

Non-magnetic structures 1010A and 1010B are formed on the sensor elements 1004A and 1004B, respectively. In one embodiment, structures 1010A and 1010B are each a polymer, such as SU8. In one embodiment, a polymer layer is deposited on sensor elements 1004A and 1004B, and then the polymer layer is etched to produce the structures 1010A and 1010B shown in FIG. 10. In one embodiment, structures 1010A and 1010B each have a conical shape with a decreasing cross-sectional area as the distance from the sensor element 1004A or 1004B increases. In another embodiment, structures 1010A and 1010B each have a convex shape.

Substrate 1002 is positioned on a chip carrier 1014, and electrical interconnects 1012A and 1012B are connected to the contacts 1006A and 1006B, respectively. The electrical interconnects 1012A and 1012B are also connected to chip carrier 1014. In one embodiment, chip carrier 1014 is a lead frame and interconnects 1012A and 1012B are bond wires. In another embodiment, chip carrier 1014 is a printed circuit board (PCB) or other chip carrier, and interconnects 1012A and 1012B are solder elements (e.g., in a flip-chip configuration) or another type of interconnect.

A magnetic mold structure 1016 is formed around the device, thereby encapsulating the substrate 1002, contacts 1006A and 1006B, sensor elements 1004A and 1004B, structures 1010A and 1010B, bond wires 1012A and 1012B, and chip carrier 1014. In one embodiment, mold structure 1016 is formed using an injection molding process. In another embodiment, mold structure 1016 is formed using a compression molding process. In one embodiment, mold structure 1016 comprises a thermosetting polymer that is filled with magnetic particles (e.g., micro magnets) or particles that are configured to be magnetized. In one embodiment, an external magnetic field is applied to sensor module 1000 to magnetize the particles in mold structure 1016, and thereby configure mold structure 1016 to produce a bias magnetic field for sensor elements 1004A and 1004B.

Embodiments of the present invention provide an improved and less expensive solution for providing a bias magnet field than the previous solutions that involve forming grooves or cavities in the bias magnet or using specially shaped guidance elements. In one embodiment, the bias magnet field is produced by packaging material (e.g., a magnetized mold compound) of a magnet sensor module, and the problems with misalignment or misplacement between sensor and magnet are eliminated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a sensor module, comprising:
   providing a substrate comprising a magnetically sensitive sensor element;
   encapsulating the sensor element and the substrate with at least one mold material that is configured to apply a bias magnetic field to the sensor element; and
   applying a non-magnetic structure over the sensor element prior to the encapsulation, wherein the non-magnetic structure has one of a substantially conical shape and a substantially convex shape.

2. The method of claim 1,
   wherein the at least one mold material encapsulates the sensor element, the non-magnetic structure, and the substrate.

3. The method of claim 2, wherein the non-magnetic structure comprises a polymer material.

4. The method of claim 2, wherein the non-magnetic structure comprises a photoresist material.

5. The method of claim 1, wherein the bias magnetic field is perpendicular to a plane of the sensor element.

6. The method of claim 1, wherein the mold material comprises a plurality of magnetic particles.

7. The method of claim 1, wherein the encapsulation is performed by an injection molding process or a compression molding process.

8. The method of claim 1, wherein the sensor element is a giant magneto resistance (GMR) element.

9. The method of claim 1, wherein the sensor element is a Hall element.

10. The method of claim 1, and further comprising:
    applying at least one electrical interconnect to the substrate.

11. The method of claim 10, wherein the at least one electrical interconnect comprises at least one bond wire, and wherein the at least one mold material encapsulates the at least one bond wire.

12. The method of claim 1, wherein the substrate comprises a semiconductor die.

13. The method of claim 1, wherein the substrate comprises a plurality of magnetically sensitive sensor elements, and wherein the method further comprises:
    applying a non-magnetic structure over each of the sensor elements prior to the encapsulation; and
    wherein the at least one mold material encapsulates the plurality of sensor elements, the non-magnetic structures, and the substrate.

14. The method of claim 1, and further comprising:
    applying the substrate to a carrier structure.

15. The method of claim 14, wherein the carrier structure is a lead frame.

16. The method of claim 14, wherein the at least one mold material encapsulates the sensor element, the substrate, and the carrier structure.

17. A sensor module, comprising:
    a substrate comprising a magnetically sensitive element;
    a non-magnetic structure positioned over the magnetically sensitive element, wherein the non-magnetic structure has one of a substantially conical shape and a substantially convex shape; and
    at least one mold structure encapsulating the magnetically sensitive element and the substrate, the at least one mold structure configured to apply a bias magnetic field to the magnetically sensitive element.

18. The sensor module of claim 17,
    wherein the at least one mold structure encapsulates the magnetically sensitive element, the non-magnetic structure, and the substrate.

19. A sensor module, comprising:
    a semiconductor substrate comprising a magnetically sensitive element;
    a polymer structure positioned over the magnetically sensitive element, wherein the polymer structure has one of a substantially conical shape and a substantially convex shape; and
    a mold with magnetic particles encapsulating the polymer structure, the magnetically sensitive element, and the substrate, the mold configured to apply a bias magnetic field to the magnetically sensitive element.

20. A method of manufacturing a sensor module, comprising:
    providing a substrate comprising a plurality of magnetically sensitive sensor elements;
    encapsulating the sensor elements and the substrate with at least one mold material that is configured to apply a bias magnetic field to the sensor elements; and
    applying a non-magnetic structure over each of the sensor elements prior to the encapsulation, wherein the at least one mold material encapsulates the plurality of sensor elements, the non-magnetic structures, and the substrate, wherein the non-magnetic structure has one of a substantially conical shape and a substantially convex shape.

* * * * *